United States Patent
Tsironis

(10) Patent No.: US 11,196,139 B1
(45) Date of Patent: Dec. 7, 2021

(54) SIMPLE DIRECTIONAL COUPLER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/860,760

(22) Filed: Apr. 28, 2020

(51) Int. Cl.
*H01P 5/18* (2006.01)
*H01P 5/04* (2006.01)
*G01R 31/26* (2020.01)
*G01R 27/32* (2006.01)

(52) U.S. Cl.
CPC .............. *H01P 5/18* (2013.01); *G01R 27/32* (2013.01); *G01R 31/2601* (2013.01); *H01P 5/04* (2013.01); *H01P 5/183* (2013.01)

(58) Field of Classification Search
CPC ... H01P 5/04; H01P 5/183; H01P 5/18; G01R 31/2601; G01R 27/32
USPC ............................................ 333/109, 110, 11
See application file for complete search history.

(56) References Cited

U.S. PATENT DOCUMENTS

| 7,135,941 | B1 | 11/2006 | Tsironis |
| 7,282,926 | B1 | 10/2007 | Verspecht et al. |
| 7,548,069 | B2 | 6/2009 | Simpson |
| 9,960,472 | B1 | 5/2018 | Tsironis |

OTHER PUBLICATIONS

Ingenieurbüro Hutter Hochfrequenztechnik (IHH), https://web.archive.org/web/20180824104031/https://directional-coupler.com/tutorials/definition-directional-coupler/, Wayback Machine Capture date Aug. 24, 2018 (Year: 2018).*
Load Pull for Power Devices [online], Microwaves101 [retrieved on Mar. 14, 2017]. Retrieved from Internet <URL: https://www.microwaves101.com/encyclopedias/ load-pull-for-power-devices>.
"Computer Controlled Microwave Tuner", Product Note 41, Focus Microwaves, Jan. 1998.
Microstrip [online], Wikipedia [retrieved on Apr. 28, 2020] Retrieved from Internet <URL: https://en.wikipedia.org/wiki/Microstrip>.
S-parameters [online], Microwaves101 [retrieved on Apr. 28, 2020] Retrieved from Internet <URL: https://www.microwaves101.com/encyclopedias/s-parameters>.
Directional Couplers [online], Microwaves101 [retrieved on Oct. 17, 2018]. Retrieved from Internet <URL: http://www.microwaves101.com/encyclopedia/directionalcouplers.cfm>.
Fourier analysis [online], Wikepidia [retrieved on Apr. 28, 2020] Retrieved from Internet <URL : https://en.wikipedia.org/wiki/Fourier_analysis>.

* cited by examiner

*Primary Examiner* — Rakesh B Patel
*Assistant Examiner* — Jorge L Salazar, Jr.

(57) ABSTRACT

Low loss high directivity wire couplers use a wire over ground transmission airline structure and a low diameter coaxial cable ending in a wire loop sensor, which is inserted into ground wall of the transmission line leading into a coupled and an isolated port. Higher, capacitively induced, electrical current, because of the confined zone between signal conductor and ground wall, compares favorably with the antiphase magnetically induced current component in the wire loop sensor and leads to increased coupling and directivity over a frequency range up to at least 70 GHz.

4 Claims, 12 Drawing Sheets

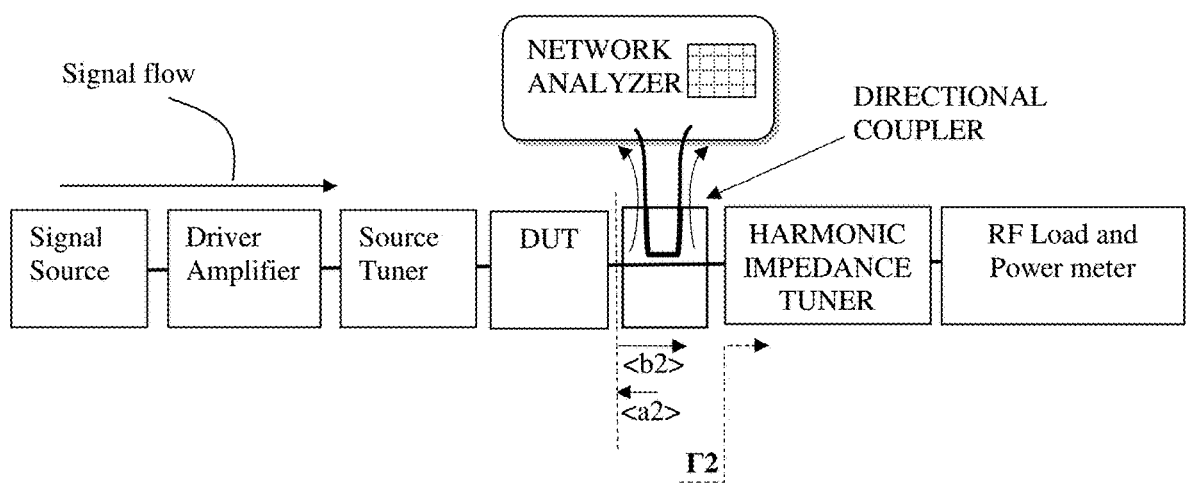
FIG. 1: Prior art

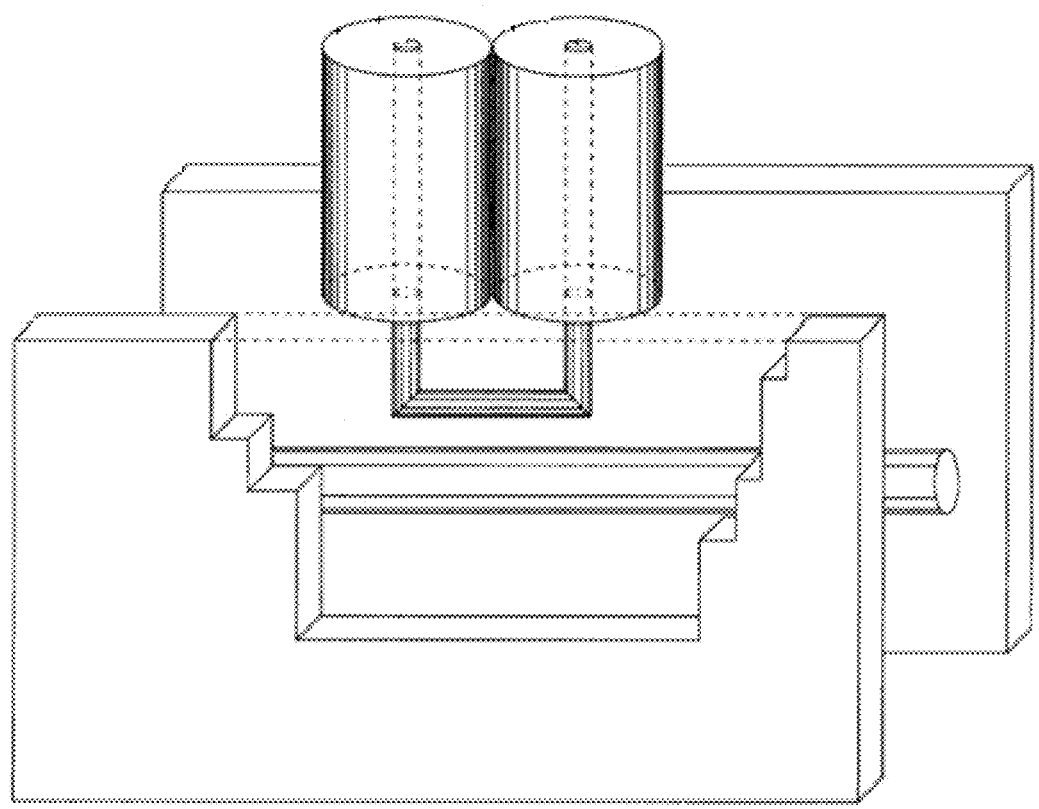
FIG. 2: Prior art

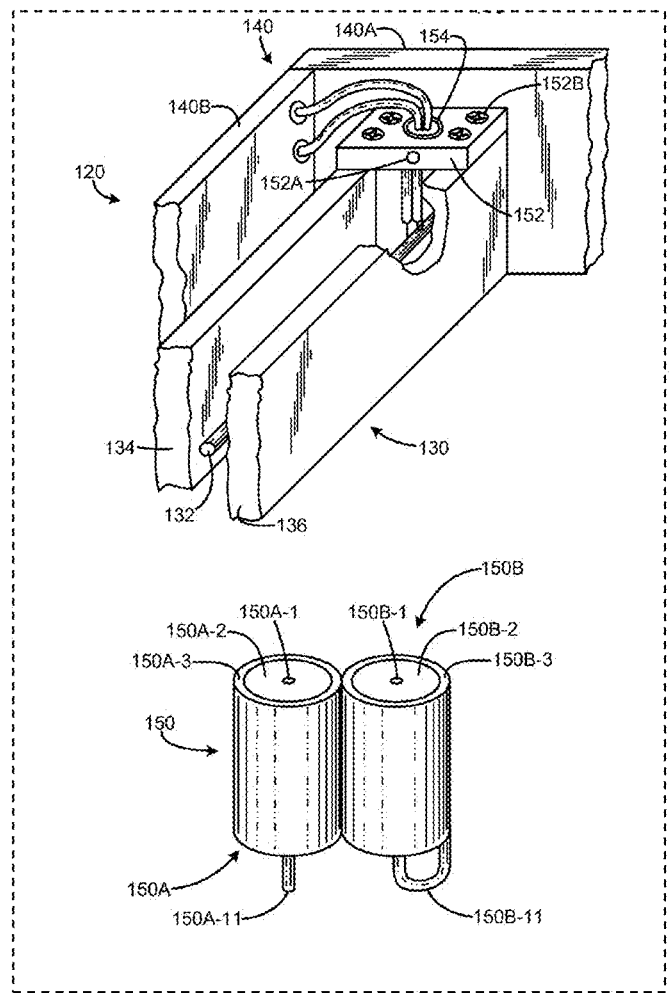
FIG. 3: Prior art: NUMBERED ITEMS ARE NOT REFERRED TO IN SPEC. (REF. 7)

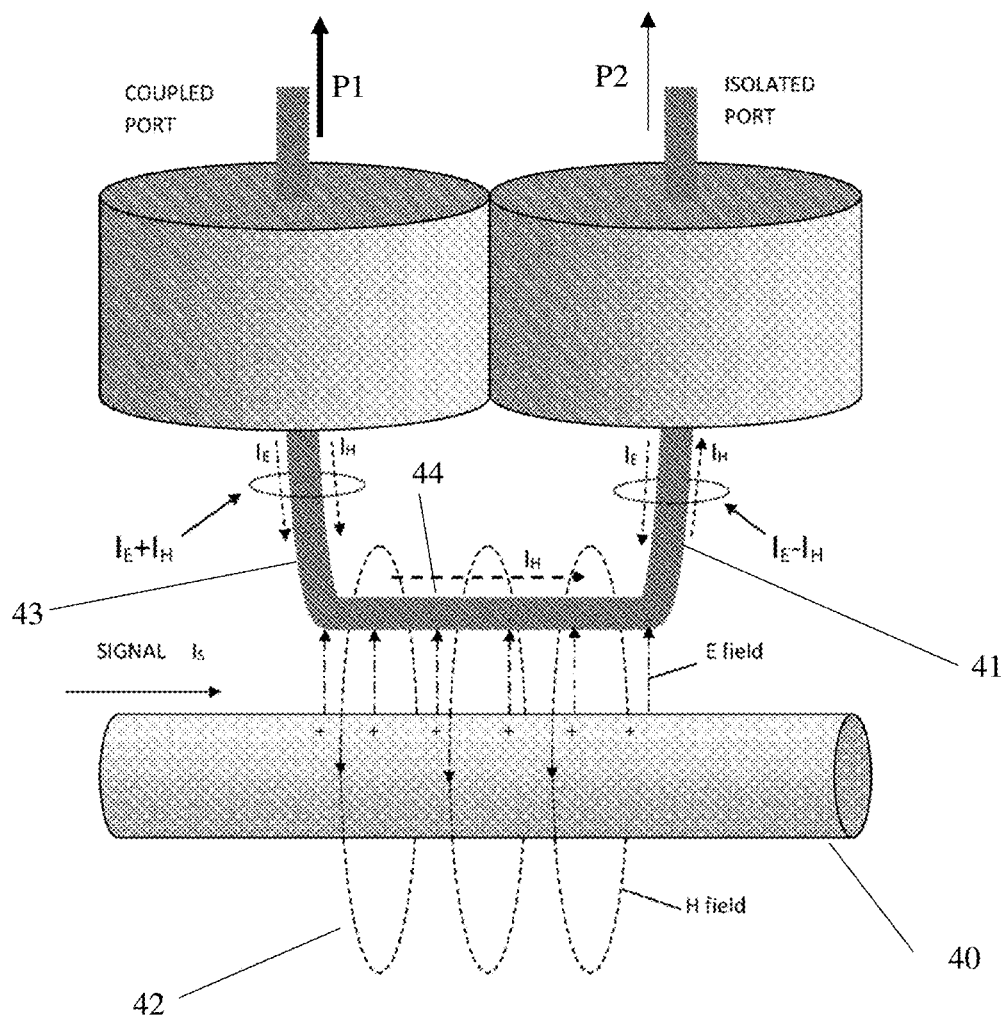
FIG.4: Prior art

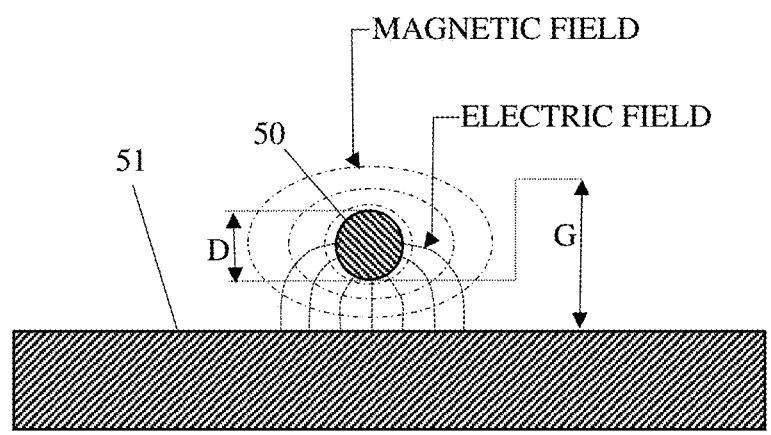
FIG. 5: Prior art

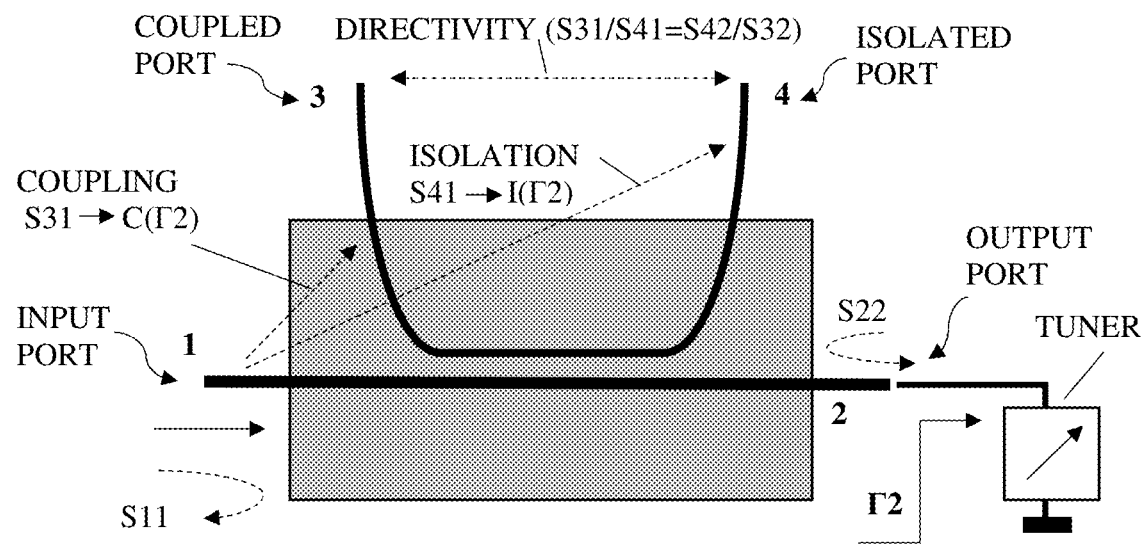
FIG. 7: Prior art

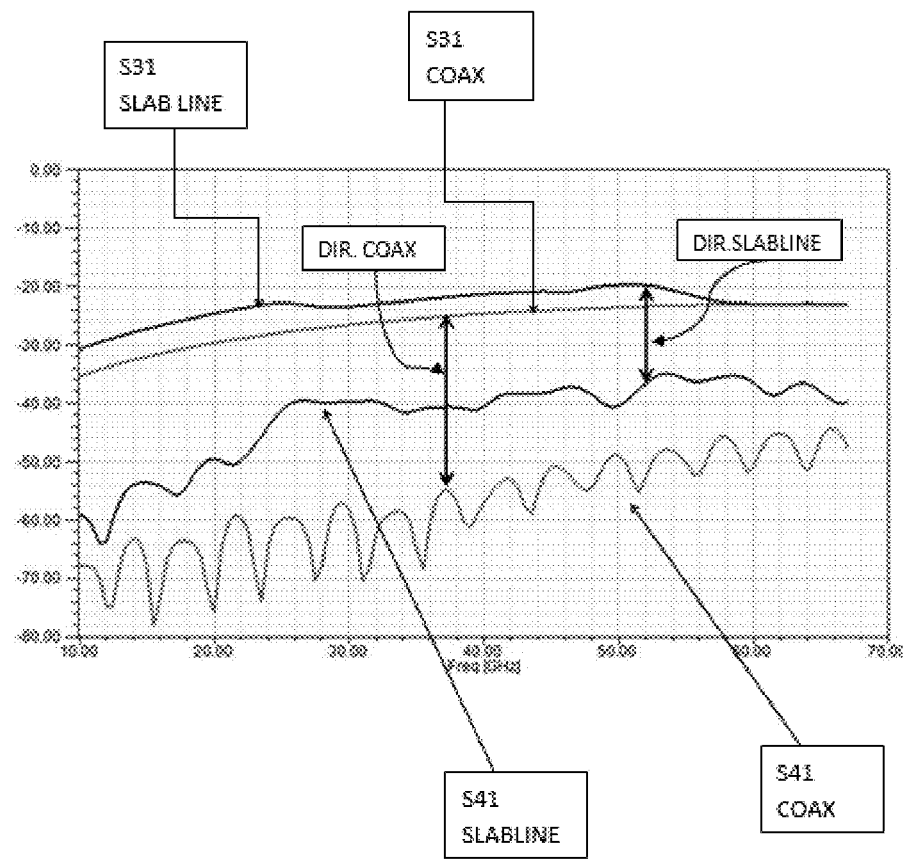
FIG.8: Prior art

SIMPLE DIRECTIONAL COUPLER

PRIORITY CLAIM

Not Applicable

CROSS-REFERENCE TO RELATED ARTICLES

1. Load Pull for Power Devices [online], Microwaves101 [retrieved on 2017-03-14]. Retrieved from Internet <URL: https://www.microwaves101.com/encyclopedias/load-pull-for-power-devices>.
2. "Computer Controlled Microwave Tuner", Product Note 41, Focus Microwaves, January 1998.
3. Microstrip [online], Wikipedia [retrieved on 2020-04-28]. Retrieved from Internet <URL: https://en.wikipedia.org/wiki/Microstrip>.
4. S-parameters [online], Microwaves101 [retrieved on 2020-04-28]. Retrieved from Internet <URL: https://www.microwaves101.com/encyclopedias/s-parameters>.
5. Directional Couplers [online], Microwaves101 [retrieved on 2018-10-17]. Retrieved from Internet <URL: http://www.microwaves101.com/encyclopedia/directionalcouplers.cfm>.
6. Verspecht et al., U.S. Pat. No. 7,282,926, "Method and an apparatus for characterizing a high-frequency device-under-test in a large signal impedance tuning environment".
7. Simpson, G., U.S. Pat. No. 7,548,069, "Signal Measurement Systems and Methods".
8. Tsironis, C., U.S. Pat. No. 7,135,941, "Triple probe automatic slide screw load pull tuner and method".
9. Fourier analysis [online], Wikipedia [retrieved on 2020-04-28]. Retrieved from Internet <URL: https://en.wikipedia.org/wiki/Fourier_analysis>
10. Tsironis, C., U.S. Pat. No. 9,960,472, "Programmable amplitude and phase controller", FIG. 9.

Introductory remark: Throughout this disclosure items on figures start with the number of the figure, for easier reading: Examples: item 55 is on FIG. 5; item 89 is on FIG. 8; item 112 is on FIG. 11; item 402 is on FIG. 4; item 202 is on FIG. 2 or 20 etc. . . . . .

FIELD OF THE INVENTION

This invention relates to testing of microwave two-ports (transistors, DUT) using linear and non-linear measurement techniques especially under controlled impedances at the input and output of the transistors (load Pull measurement, see ref. 1) and also measuring and analyzing the large signal behavior of a DUT.

BACKGROUND OF THE INVENTION

A popular method for testing and characterizing microwave transistors at high power nonlinear operation is "load pull" and "source pull" (see ref. 1). Load pull or source pull are measurement techniques employing microwave tuners (see ref. 2) and other microwave test equipment. The microwave tuners in particular are used to manipulate the microwave impedance conditions under which the Device Under Test (DUT, or transistor) is tested (FIG. 1). Bi-directional signal couplers are needed to detect the signal waves propagating along the transmission line towards <a> and away <b> from the DUT (FIG. 1) and to allow performing harmonic Fourier analysis (see ref. 9) in order to reconstruct the real-time non-linear transistor response. Further-on the instantaneous voltage-current trajectory of a transistor, typically called the "load-line", (see ref. 6) will depend on the complex impedance presented to the transistor using harmonic tuners (see ref. 8). A setup that allows this test is a "harmonic load pull setup" as shown in FIG. 1.

DESCRIPTION OF PRIOR ART

Bi-directional signal couplers have been known since long time (see ref. 4); They detect forward <a> and reverse <b> travelling waves on the transmission line and transfer the measured data to the VNA (FIG. 1). In order for the data to be valid the couplers must be calibrated by measuring their scattering (s-) parameters before (see ref. 4) and de-embed to the DUT reference plane. Typical s-parameter calibration occurs under 50Ω termination conditions (FIG. 7). However, when the terminations are non-50Ω, the coupling behavior, forward C and reverse I (isolation) change. The signal detected at the coupled port comes from both the input port and as part of the signal returning from a non-50Ω termination (Γ2) at the output port. In load pull operations in particular the tuners create (on purpose) non-50Ω test conditions. The relation describing this phenomenon is:

$$C(\Gamma 2)=S31+S32*S21*\Gamma 2/(1-\Gamma 2*S22)\approx S31+S32*\Gamma 2 \quad \{\text{eq. 1}\}$$

and $$I(\Gamma 2)=S41+S42*S21*\Gamma 2/(1-\Gamma 2*S22)\approx S41+S42*\Gamma 2 \quad \{\text{eq. 2}\}$$

whereby Γ2 is the reflection created by the tuner at port 2 and C(Γ2) and I(Γ2) are the new values of the transmission S31 and isolation S41 between port 1 and ports 3 and 4 or the ratio of signal power detected at ports 3 and 4 divided by the injected signal power into port 1 (FIG. 7). The Directivity is a coupler property defined as S31/S41=S42/S32, depending which port, 1 or 2, is defined as the input port. If Γ2=0 then C(0)=S31 and I(0)=S41, as follows from {eq.1, 2}. The important quantities are S32 and Γ2, that is the isolation and the load reflection factor; since |S21|≈1, and |S22|≈0 it is, finally, the product Γ2*S32 that determines the sensitivity of the coupling factor on the mismatch created by the tuner. An ideal directivity coupler should therefore have a Directivity of infinite, or S41=S32=0. This not being possible, "Directivity" is a key and distinguishing performance of any directional coupler, especially when used in a non-50Ω, i.e. |Γ2|>0 test environment as shown in FIGS. 1 and 7. Commercially available compact wideband couplers (see ref. 5) have Directivity values between 10 and 20 dB. The coupler presented here is simpler to make, is extremely wideband and exceeds this level of Directivity.

BRIEF DESCRIPTION OF THE INVENTION

Signal couplers are in general bi-directional. When the isolated port (FIG. 7) is terminated with characteristic impedance, i.e., no signal is reflected back into the coupler, it is called a directional coupler, because the larger portion of the detected signal comes from one direction (forward). Of course, because the couplers are bi-directional, in reverse direction the isolated port becomes the coupled port and the coupled port becomes the isolated port. The couplers dealt with in this disclosure are bi-directional couplers. The directional coupler of the present invention (FIGS. 6A and 6B) uses the wire-over-ground (WOG) transmission line structure and the advantages offered by this embodiment are:
a) the simplicity of the transmission airline (one ground-wall instead of two) offering the benefit of relaxed parallelism requirements, which are mandatory in a slabline (FIG. 2), and b) the stronger concentration of electric field in the zone between signal conductor and closer-by ground surface (FIG. 5), which leads to higher capacitive coupling and induced electric currents; such electrically induced currents, when added to the magnetically induced currents (FIG. 4), increase the forward coupling by roughly 16 dB (FIGS. 9A and 9B), comparison between prior art IV-probe, FIG. 3, wave-probe, FIG. 2, ref. 6, shown as NEW versus TOP) and greater Directivity by 15 dB. Directivity data of prior art IV couplers (see ref. 7) are known to be inferior. The coupler is made by inserting a U-shaped electro-magnetic wire loop sensor into a hole in the ground-wall at the level of the signal conductor and connecting its branches to coaxial cables leading to the coupled and isolated coaxial ports.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art a Load pull test setup for measuring power contours and real time incident and reflected waves and load reflection factor of a DUT, using bi-directional coupler and network analyzer.

FIG. 2 depicts prior art, signal coupler of type "wave-probe".

FIG. 3 depicts prior art, a voltage-current (I-V) coupler.

FIG. 4 depicts prior art, magnetically induced and capacitively coupled currents inside the coupling loop of a wire coupler.

FIG. 5 depicts prior art, electric and magnetic field distribution in a transmission line using the "wire over ground, WOG" concept, and the "distance to ground over wire diameter" ratio yielding characteristic impedance Zo=50 Ohms.

FIG. 6A depicts a cross section at the wire loop level; FIG. 6B depicts a top view.

FIG. 7 depicts prior art, definition of transmission, reflection and coupling RF parameters in a directional coupler.

FIG. 8 depicts prior art, comparison of coupling and isolation (i.e. Directivity) of coaxial and slabline based wire couplers.

FIG. 9A depicts schematically the compared embodiments; FIG. 9B depicts comparison of coupling and isolation coefficient of three wire-coupler configurations from 2 to 68 GHz: NEW is the coupler of this invention (WOG, wire over ground), SIDE is a configuration where the wire loop sensor is inserted perpendicular to the slabline wall and TOP is the configuration where the wire loop sensor is inserted from the top into the slot of the slabline, as in prior art of FIG. 2.

FIG. 11A depicts coupling and isolation; FIG. 11B depicts return loss.

DETAILED DESCRIPTION OF THE INVENTION

Figure 6A:
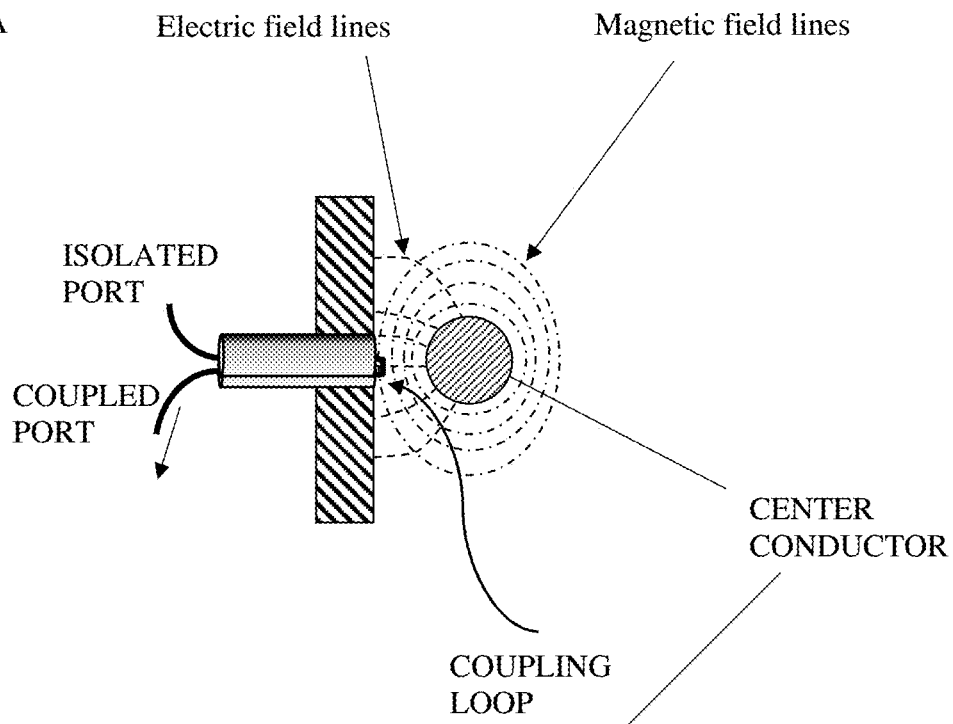
FIG. 6A through 6B depict a wire over ground (WOG) high coupling and directivity coupler.

The simple directional coupler uses a low loss wire-over-ground (WOG) transmission airline which is popular mostly in form of a dielectric substrate based microstrip configuration (see ref. 3). The advantages offered by this method are twofold: a) it is mechanically simpler than a coaxial or a parallel-plate airline (slabline); b) it offers a stronger electric field concentration in the zone between signal conductor and ground wall. The simplicity of the WOG transmission airline allows a relaxed parallelism requirements; the stronger concentration of electric field in the zone between signal conductor and closer-by ground plan (FIG. 5) leads to higher induced electric currents, in the wire loop sensor, which increases the coupled signal and decreases the isolated signal, thus increasing the coupling and directivity at the same time. Knowing that too-low coupling factors and limited directivity are the weaknesses of such wire couplers, this solution is twofold beneficial.

The coupling and isolation mechanism, first described in ref. 6 works as follows (FIG. 4): the RF signal current Is inside the signal conductor (40) creates a magnetic field H around it. This pulsing magnetic field H (42) couples into the parallel running wire loop sensor (41-43) and creates a magnetically induced current $I_H$ which flows from branch (43) through the bottom of the "U" shaped loop (44) into branch (41). Since the bottom of the wire loop sensor runs parallel to the signal conductor (40) there is a capacitive coupling between the two. This capacitive coupling induces, capacitive current $I_E$ into either 50 Ohm terminated branches (41) and (43). These currents are proportional to the electric field in this region. Inside branch (43) the magnetically induced current $I_H$ and the electric one $I_E$ add yielding a total current $I_H+I_E$. Inside branch (41) these currents run anti-phase and subtract. The total signal power in the load to branch (43) is therefore $|I_E+I_H|^2*Zo$ and in branch (41) $|I_H-I_E|^2*Zo$. This creates both the forward coupling into branch (43) and the isolation in branch (41).

Since the predominant coupling mechanism is magnetic $I_H$ is always larger than $I_E$. Or, if we can increase $I_E$ the difference $I_H-I_E$ in branch (41) tends towards zero. This increases isolation and directivity. At the same time, it also increases $I_H+I_E$; this increases forward coupling. The objective is therefore to increase $I_E$.

This is achieved using the WOG structure, where, due to the higher proximity between the signal conductor and the ground the electric field (and the capacitive coupling with the wire loop sensor) are strongest among the various structures studied so far (FIGS. 8 and 9). For characteristic impedance Zo=50 Ohms, in a cylindrical coaxial structure the ratio gap G between the center conductor (50) with diameter D—and external mantle (51) is G/D=0.651. In a slabline structure the ratio is G/D=0.406. And in a WOG structure (FIG. 5) it is G/D=0.152. This indicates that capacitive coupling and electric field is strongest in the WOG structure. The strength of the capacitive coupling increases by the inverse of the corresponding G/D. The prior art embodiment of FIG. 2, is, in this respect, an outsider, both regarding strong coupling and high directivity, since the wire loop sensor is inserted in the region of the weakest electric and weak magnetic fields.

Figure 9A:
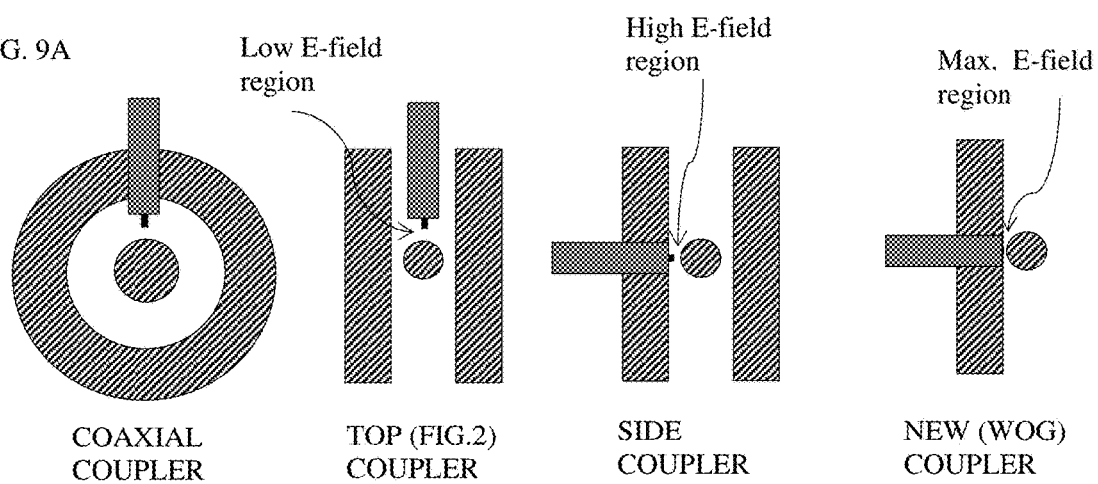
FIG. 9A through 9B depict partly prior art i.e. all figures and traces not marked NEW.

In FIG. 8, a comparison is shown between the original slabline-based structure (FIG. 2) with a coaxial structure, where the cylindrical center conductor traverses a cylindrical tube, as shown in FIG. 9A. The fact that the wire loop sensor in FIG. 2 is placed in free space above the center conductor in the region of low electric field, shows in low coupling and directivity, compared with the coaxial structure where both the electric and magnetic fields are homogenous and stronger.

Figure 6B:
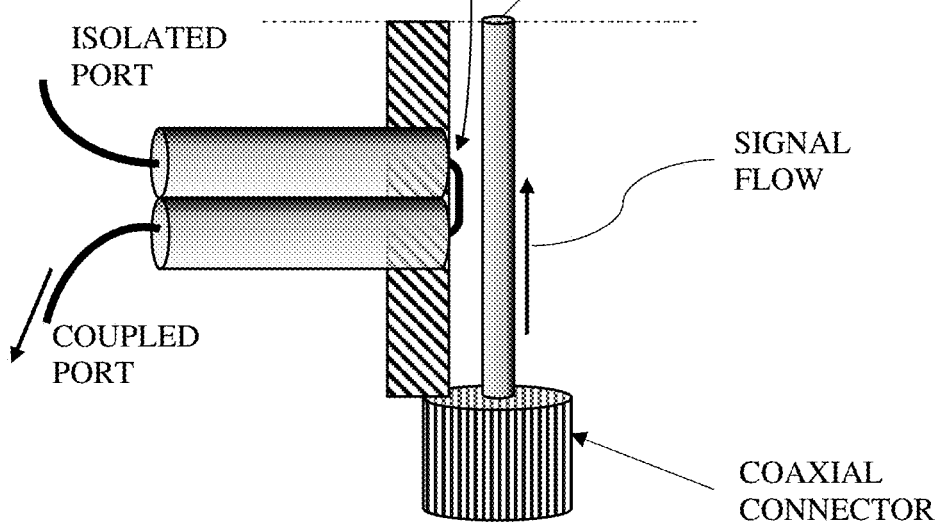
Figure 9B:
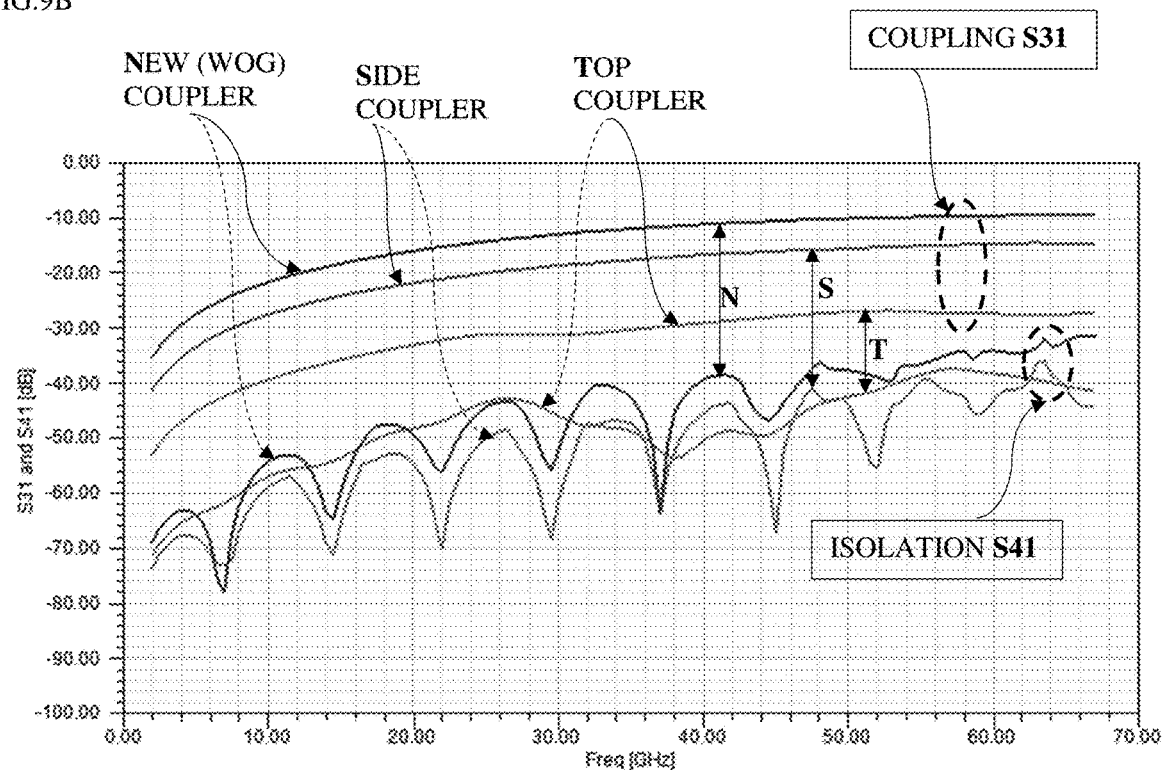
Figure 12:
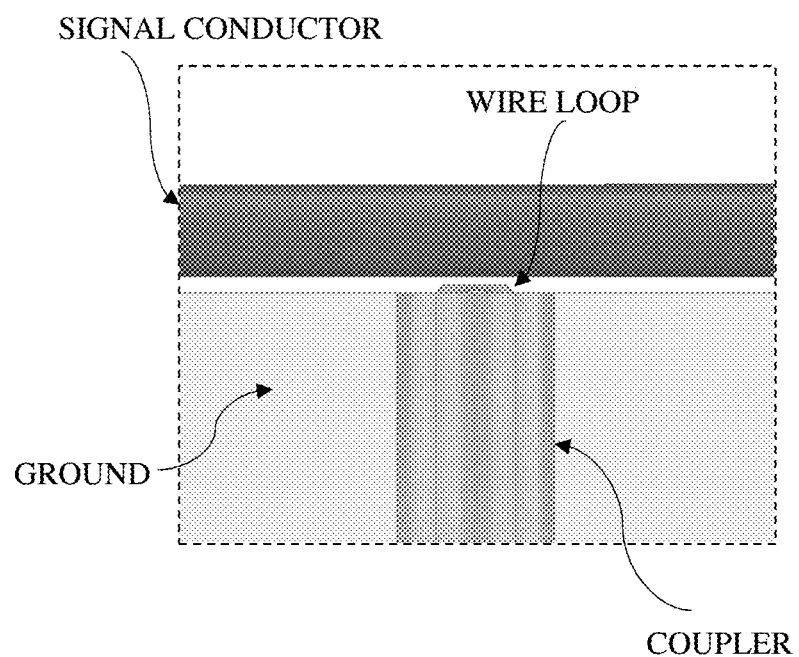
FIG. 12 depicts top view of detailed structure of the directional coupler of the present invention

FIG. 9B compares the coupling and directivity of three non-cylindrical coaxial structures: TOP coupler is the original slabline based structure of FIG. 2; it shows the weakest performance, both in coupling and directivity, because the wire loop sensor is placed in an region of weak electric and magnetic field. Main reason for this embodiment is the absence of modifications to the airline and main advantage is the possibility to move the wire loop sensor along the slabline to control the coupling phase, whatever this may be beneficial for (see ref. 10). SIDE coupler is a slabline based structure, where the wire loop sensor is inserted into a hole in one side-wall as close to the center conductor as possible. Here the electric field is approximately 5× stronger than in the space above the center conductor, leading to higher electric coupling yielding 13 dB higher forward coupling and also approximately 13 dB higher directivity. NEW coupler is the WOG-based embodiment, where the wire loop sensor is inserted into a perpendicular hole in the ground wall (FIGS. 6A, 6B and 12), yielding the highest electric coupling and leading to the highest coupling factor (18 dB more than FIG. 2 and 5 dB more than the side coupler) and approximately 3 dB higher directivity than the side coupler and 16 dB higher directivity than FIG. 2. Compared with the cylindrical coaxial embodiment of FIG. 8 the new coupler is in par concerning directivity (obviously because in the coaxial case both the magnetic and electric currents are equally weaker) but exceeds the cylindrical coaxial embodiment in forward coupling by at least 12 dB (−22 dB versus −10 dB).

Figure 10:
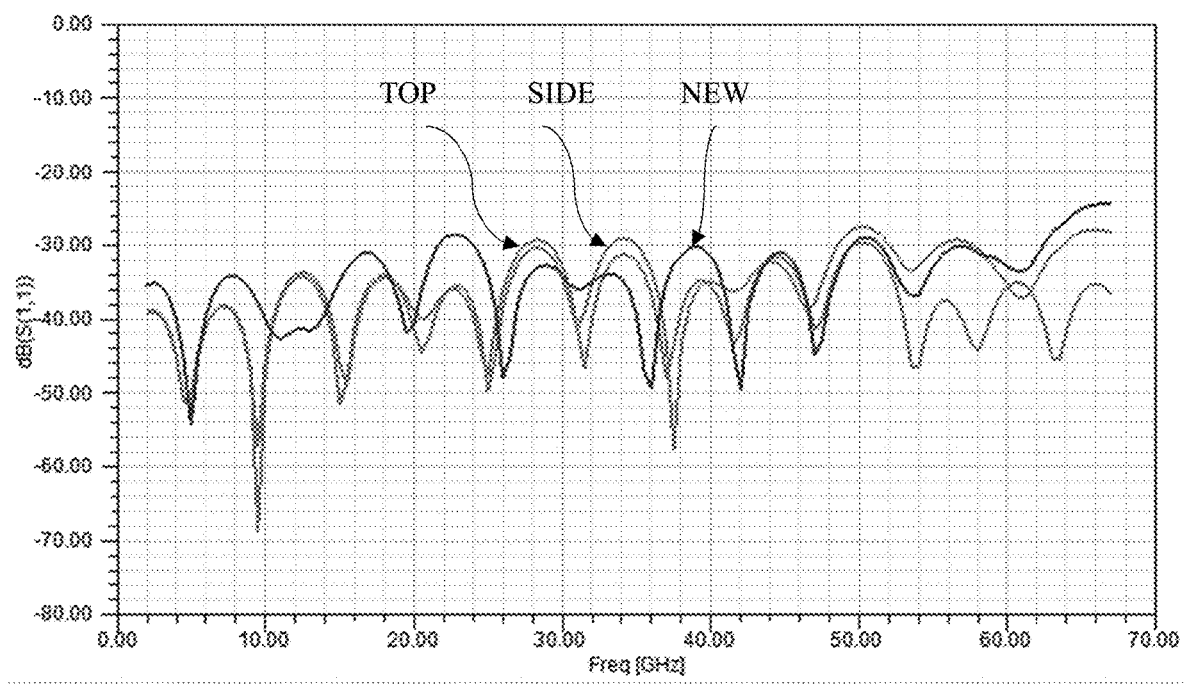
FIG. 10 depicts partly prior art, return loss of wire coupler configurations as in FIG. 9A.
Figure 11A:
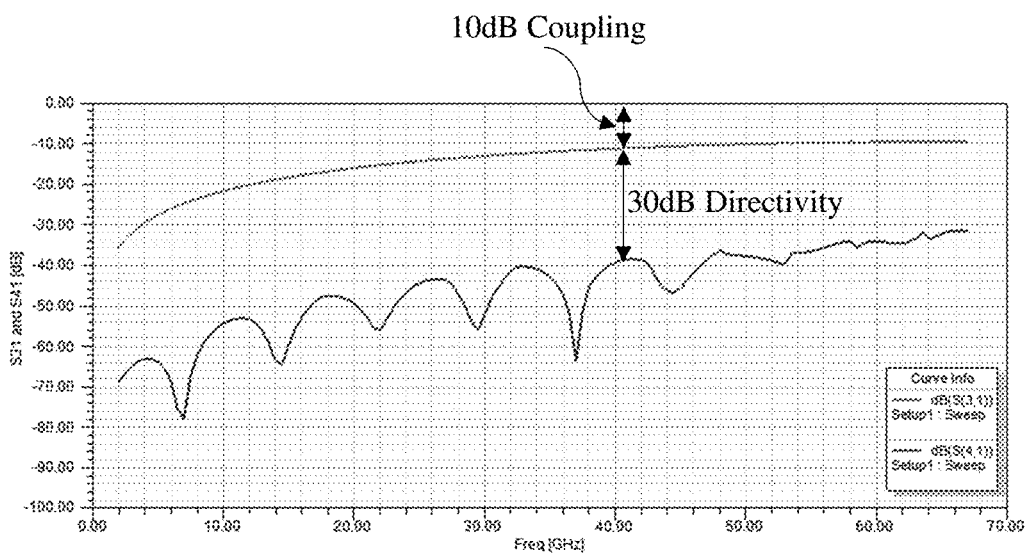
FIG. 11A through 11B depict characteristics of the embodiment of the present invention.
Figure 11B:
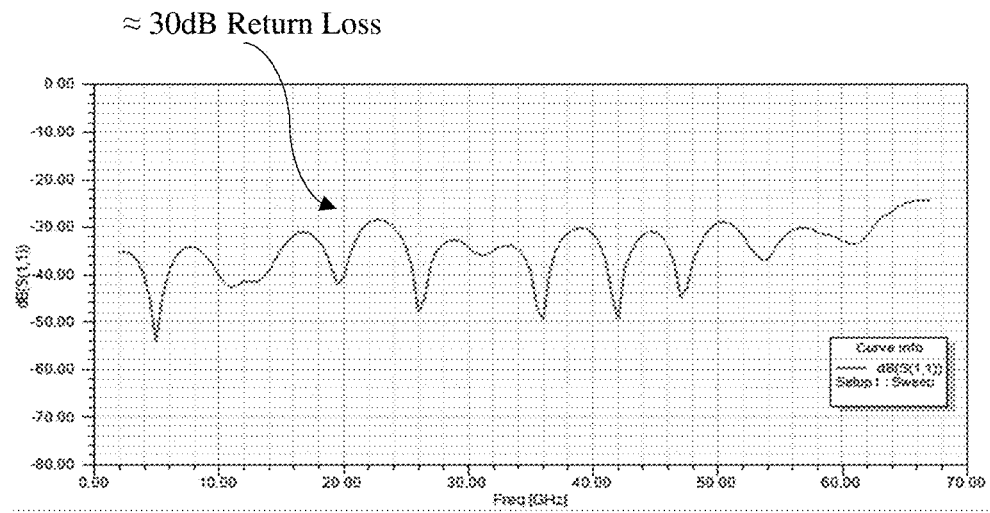

The protrusion of the wire coupler into the high field area of the cavity of the transmission line (FIGS. 6A, 6B and 12) is a reason of concern regarding the residual return loss of the coupler. FIG. 10 shows a comparison of three of the embodiments of FIG. 9A. It is clear that the results do not differ significantly. In all cases the residual return loss does not exceed approximately 30 dB, which, realistically, is acceptable for any practical application.

In conclusion the new WOG (wire over ground) embodiment is superior in coupling to all alternative embodiments and superior in directivity to all, except the coaxial structure, where they are equal. Obvious alternatives and modifications to the herein disclosed general concept of the use of a WOG transmission line for making a wideband high coupling and directivity wire coupler shall not impede in the validity of the invention.

What is claimed is:

1. A directional RF signal coupler having
   an input port, an output port, a coupled port and an isolated port,
   said directional RF signal coupler comprising:
   a) a wire-over-ground transmission airline between the input and output ports, said wire-over-ground transmission airline comprising a metallic ground wall and a signal conductor between the input and output ports, and
   b) a "U" shaped electro-magnetic wire loop sensor having a bottom section and two branches;
   wherein
   the "U" shaped electro-magnetic wire loop sensor is inserted in a hole of the metallic ground wall and protrudes into an area between the metallic ground wall and the signal conductor with the bottom section running parallel to the signal conductor,
   and wherein
   each branch of the "U" shaped electro-magnetic wire loop sensor extends into a center conductor of a coaxial cable terminating into either the coupled or the isolated port.

2. The directional RF signal coupler of claim 1,
   wherein
   the "U" shaped wire loop sensor is inserted in a zone, where the signal conductor is closest to the ground wall.

3. The directional RF signal coupler of claim 1,
   wherein
   the signal conductor is cylindrical in shape.

4. The directional RF signal coupler of claim 1,
   wherein
   a characteristic impedance of wire-over-ground transmission airline is 50 Ohms.

* * * * *